United States Patent [19]

Tsuboi

[11] Patent Number: 5,760,447

[45] Date of Patent: Jun. 2, 1998

[54] SEMICONDUCTOR DEVICE HAVING PULL-UP OR PULL-DOWN RESISTANCE

[75] Inventor: Toshihide Tsuboi, Tokyo, Japan

[73] Assignee: NEC Corporation, Japan

[21] Appl. No.: 710,811

[22] Filed: Sep. 23, 1996

[30] Foreign Application Priority Data

Oct. 4, 1995 [JP] Japan ................................. 7-257727

[51] Int. Cl.[6] ................................................ H01L 23/62
[52] U.S. Cl. ..................... 257/359; 257/358; 257/360; 257/363; 257/379; 257/380
[58] Field of Search .......................... 257/379, 296, 257/350, 358, 359, 360, 363, 380

[56] References Cited

U.S. PATENT DOCUMENTS

| | | | |
|---|---|---|---|
| 3,967,295 | 6/1976 | Stewart | 257/358 |
| 4,143,391 | 3/1979 | Suzuki et al. | 257/358 |
| 4,264,941 | 4/1981 | London | 257/358 |
| 4,617,482 | 10/1986 | Matsuda | 257/358 |
| 4,725,875 | 2/1988 | Hsueh | 257/350 |
| 4,757,363 | 7/1988 | Bohm et al. | 257/358 |
| 4,763,184 | 8/1988 | Krieger et al. | 257/358 |
| 4,963,505 | 10/1990 | Fujii et al. | 257/350 |
| 5,028,819 | 7/1991 | Wei et al. | 257/379 |
| 5,489,547 | 2/1996 | Erdeljac et al. | 257/350 |
| 5,581,105 | 12/1996 | Huang | 257/379 |
| 5,637,900 | 6/1997 | Ker et al. | 257/358 |

FOREIGN PATENT DOCUMENTS

| | | |
|---|---|---|
| 0291242 | 11/1988 | European Pat. Off. . |
| 0312097 | 4/1989 | European Pat. Off. . |
| 52-043376 | 4/1977 | Japan . |
| 405136350 | 6/1993 | Japan .................. 257/358 |

OTHER PUBLICATIONS

Smelters et al; "Latchup Considerations In Standard Cell Cmos Design"; May 1986; pp. 104-108; IEEE International Symposium on Circuits and Systems, vol. 1.

*Primary Examiner*—Ngân V. Ngô
*Attorney, Agent, or Firm*—Hayes, Soloway, Hennessey, Grossman & Hage, P.C.

[57] ABSTRACT

A semiconductor device includes a CMOSFET, including n-channel and p-channel MOSFETs. A terminal is connected to a node connecting the drains of the MOSFETs. A pull-up or pull-down resistor is connected between the terminal and a power source potential. The pull-up or pull-down resistor is composed of two serially-connected resistances. One of the two serially connected resistances is connected to the terminal and is formed of a resistance material that does not form a pn junction with a semiconductor substrate, and the other of the two resistances is formed of a diffusion layer of conduction type that forms a pn junction with the semiconductor substrate.

9 Claims, 12 Drawing Sheets

SEMICONDUCTOR DEVICE HAVING PULL-UP OR PULL-DOWN RESISTANCE

BACKGROUND OF THE INVENTION

The present invention relates to a semiconductor device having pull-up or pull-down resistance, and in particular to a CMOS semiconductor device having pull-up or pull-down resistance.

Figure 1:
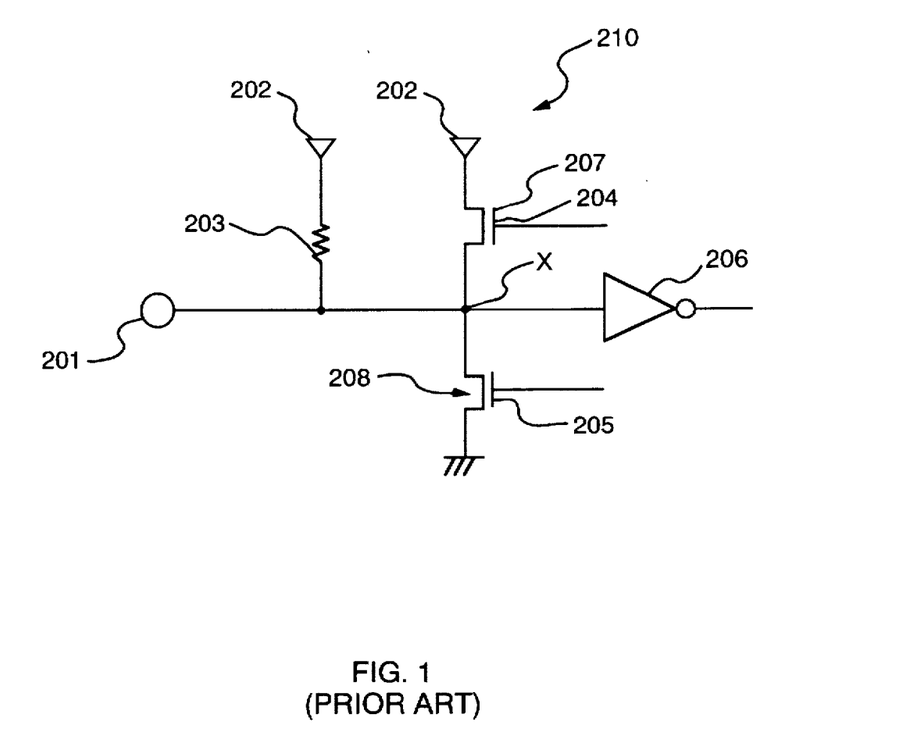
FIG. 1 shows one example of the circuit of a semiconductor device having pull-up resistance of the prior art.

FIG. 1 shows one example of a semiconductor device circuit of the prior art having pull-up resistance. The circuit shown in FIG. 1 is an input/output buffer circuit that can operate both as an input buffer circuit and as an output buffer circuit. This circuit is composed of input/output terminal (hereinafter referred to as "a terminal") 201, pull-up resistance 203, CMOS circuit 210, and input buffer 206. Output terminal X of CMOS circuit 210 (the node connecting the drain of p-channel MOSFET 207 and the drain of n-channel MOSFET 208) is connected both to terminal 201 and to the input terminal of input buffer 206. Pull-up resistance 203 is connected between operating voltage supply 202 and terminal 201. Terminal 201 serves as an input terminal when the input/output buffer circuit of FIG. 1 is used as an input buffer circuit, and serves as an output terminal when the input/output buffer circuit is used as an output buffer circuit.

The gate 204 of the p-channel MOSFET and the gate 205 of the n-channel MOSFET are supplied with the output signals of a two-output gate circuit (not shown in the figure). When the input/output buffer circuit of FIG. 1 is used as an input buffer circuit, this gate circuit provides an output of a high-level to gate 204 of p-channel MOSFET 207 and an output of a low-level to gate 205 of n-channel MOSFET 208. As a result, p-channel MOSFET 207 and n-channel MOSFET 208 both enter a high-impedance state. When the input/output buffer circuit is used as an output buffer circuit, the gate circuit not shown in the figure delivers identical data signals to gate 204 of p-channel MOSFET and gate 205 of n-channel MOSFET. In this case, accordingly, CMOS circuit 210 operates as a CMOS inverter.

This input/output buffer circuit operates as follows: First, as described hereinabove, when the input/output buffer circuit is used as an input buffer circuit, p-channel MOSFET 207 and n-channel MOSFET 208 both enter a high-impedance state. Data signals received at terminal 201 are directly supplied to input buffer 206, the logic levels of data signals are discriminated at input buffer 206, and data signals for which logic levels have been determined are transmitted to an internal circuit (not shown). If terminal 201 is not connected to an external circuit, the potential of terminal 201 becomes high level due to pull-up resistance 203, thereby preventing terminal 201 from entering a floating state.

When input/output buffer circuit is used as an output buffer circuit, CMOS circuit 210 operates as an inverter as described hereinabove, and accordingly, a data signal supplied to the gates of CMOS circuit 210 is inverted and transmitted from terminal 201.

Figure 2:
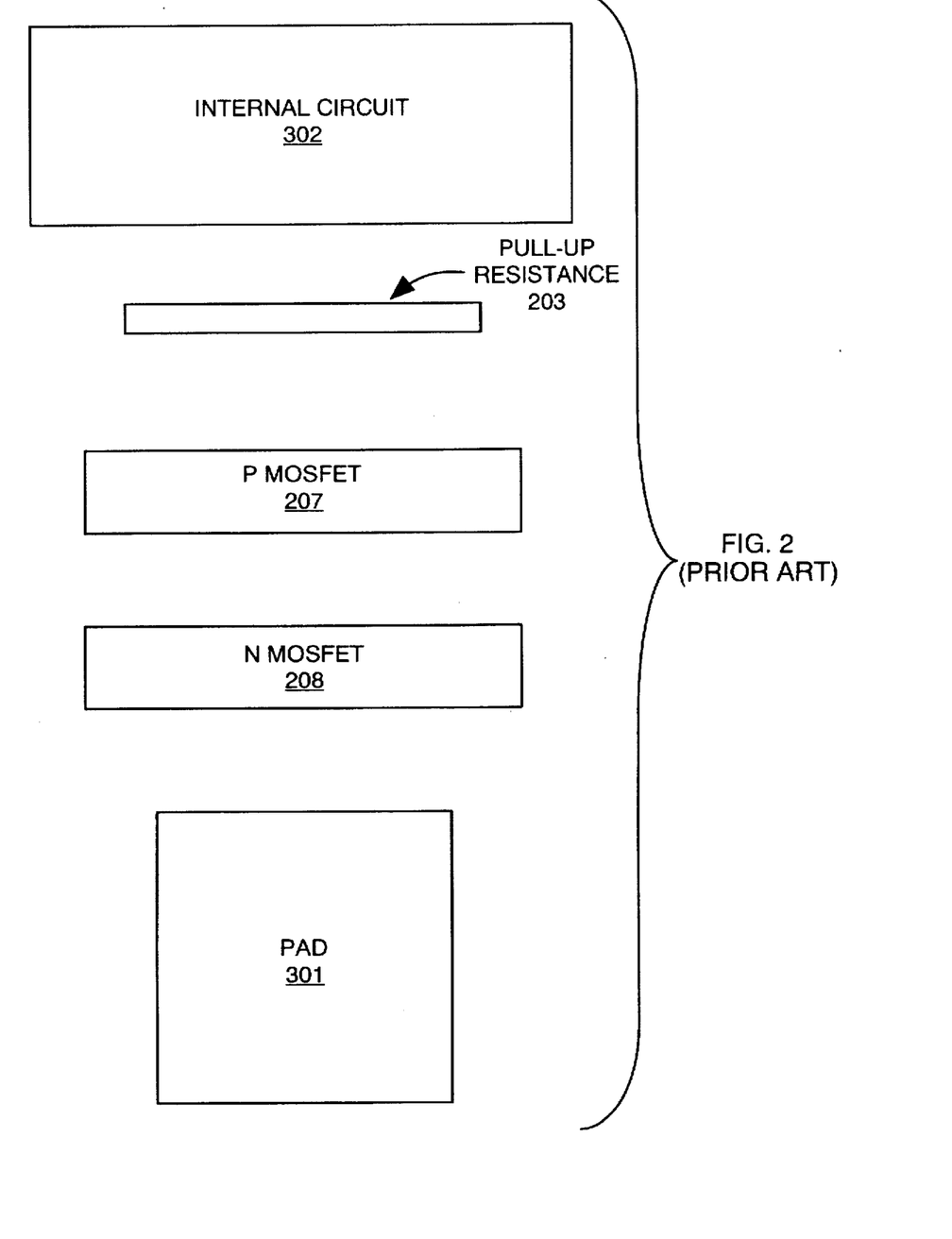
FIG. 2 is a plan view showing the layout of the circuit of FIG. 1.

FIG. 2 is a plan view showing an example of the layout of the circuit of FIG. 1. In FIG. 2, reference numeral 301 denotes a pad including terminal 201, and reference numeral 302 denotes a region in which an internal circuit is arranged. N-channel MOSFET 208, p-channel MOSFET 207 and pull-up resistance 203 are arranged between pad 301 and internal circuit 302 in that order beginning from the pad 301 side.

Figure 3:
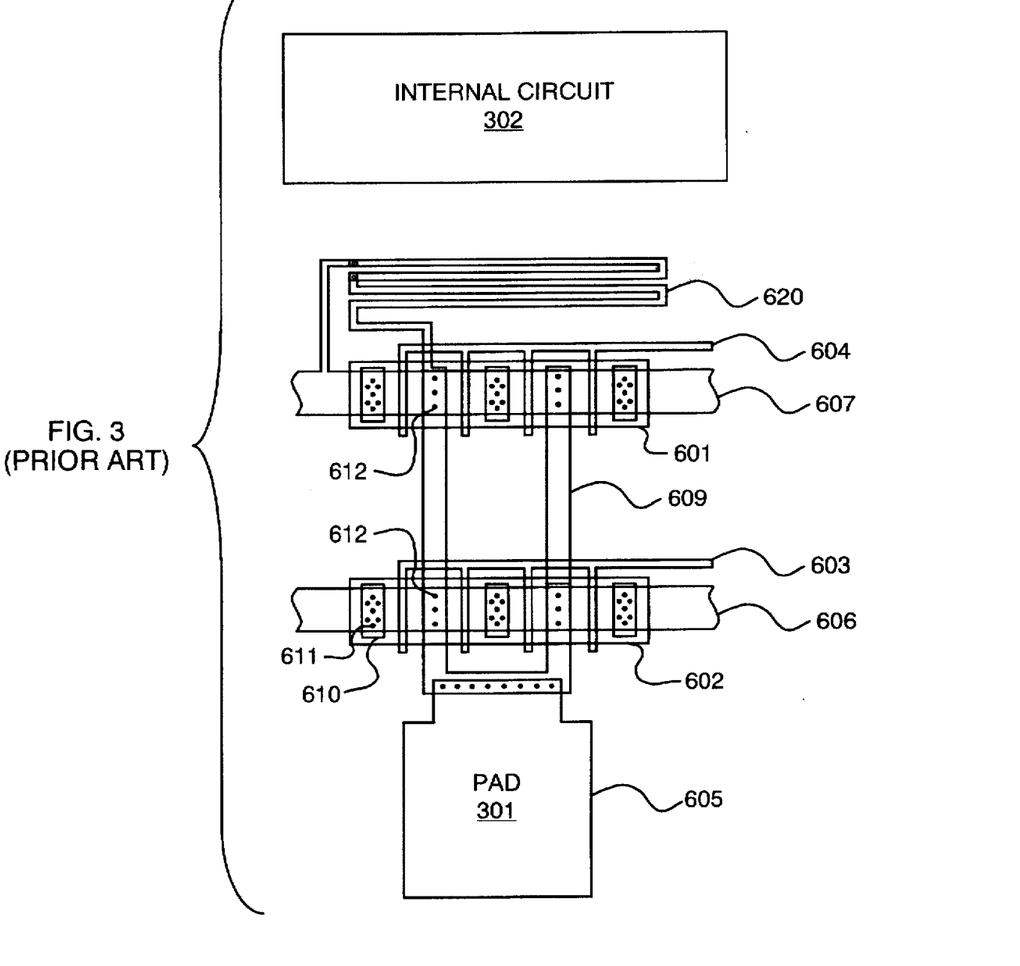
FIG. 3 is a plan view showing the details of the arrangement of the circuit of FIG. 2.

FIG. 3 is a plan view showing the details of the configuration of the circuit shown in FIG. 2. In FIG. 3, p-type diffusion layer (p-type DL) 601 is a region making up the source and drain of p-channel MOSFET 207, and polysilicon 604 is the gate of p-channel MOSFET 207. Second aluminum wiring 607 is wiring that supplies the potential of operating voltage supply 202 to the source of p-channel MOSFET 207 by way of first diffusion layer aluminum (DL-1Al) contacts.

N-type diffusion layer (n-type DL) 602 represents an area making up the source and drain of n-channel MOSFET 208, and polysilicon 603 is the gate of n-channel MOSFET 208. Second aluminum wiring 606 supplies the ground potential to n-channel MOSFET 208 as source potential by way of first diffusion layer aluminum contacts 611. Since the second aluminum wiring, which is an upper-layer wiring, cannot make direct contact with the diffusion layer, first aluminum wiring 610, which is a lower-layer wiring, serves as interconnect to make electric contact between the diffusion layer and second aluminum wiring. First aluminum wiring 609 connects pad 301, the drain of p-channel MOSFET 207, and the drain of n-channel MOSFET 208 by way of first diffusion layer aluminum (DL-1Al) contacts 612.

In addition, n-type diffusion layer 620 forms pull-up resistance 203, and is connected between second aluminum wiring 607, which is applied with the power-source potential (the potential of operating voltage supply 202) and first aluminum wiring 609, which is connected to the terminal (pad 301). Pad 301 is formed of second aluminum wiring.

Figure 4:
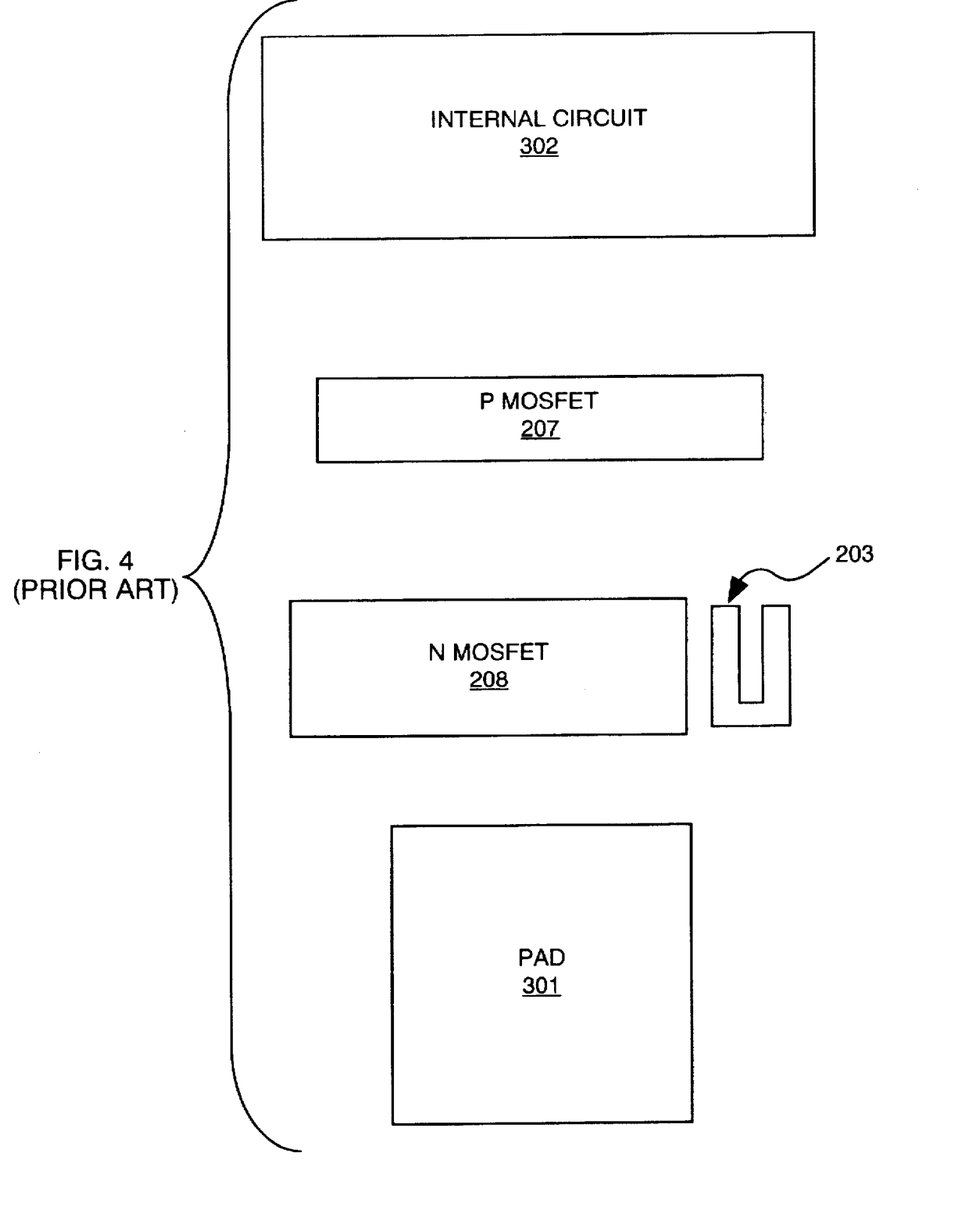
FIG. 4 shows another layout of the circuit of FIG. 1.

FIG. 4 shows another example of the layout of the circuit of FIG. 1. In the figure, pull-up resistance 203 is arranged to the side of n-channel MOSFET 208. In this example, pull-up resistance 203 is made of an n-type diffusion layer. The reason for pull-up resistance 203 being arranged to the side of n-channel MOSFET 208 is that, by reason of pull-up resistance 203 being an n-type diffusion layer directly connected to terminal 201, i.e., pad 301, it must be spaced apart from p-channel MOSFET 207.

Figure 5:
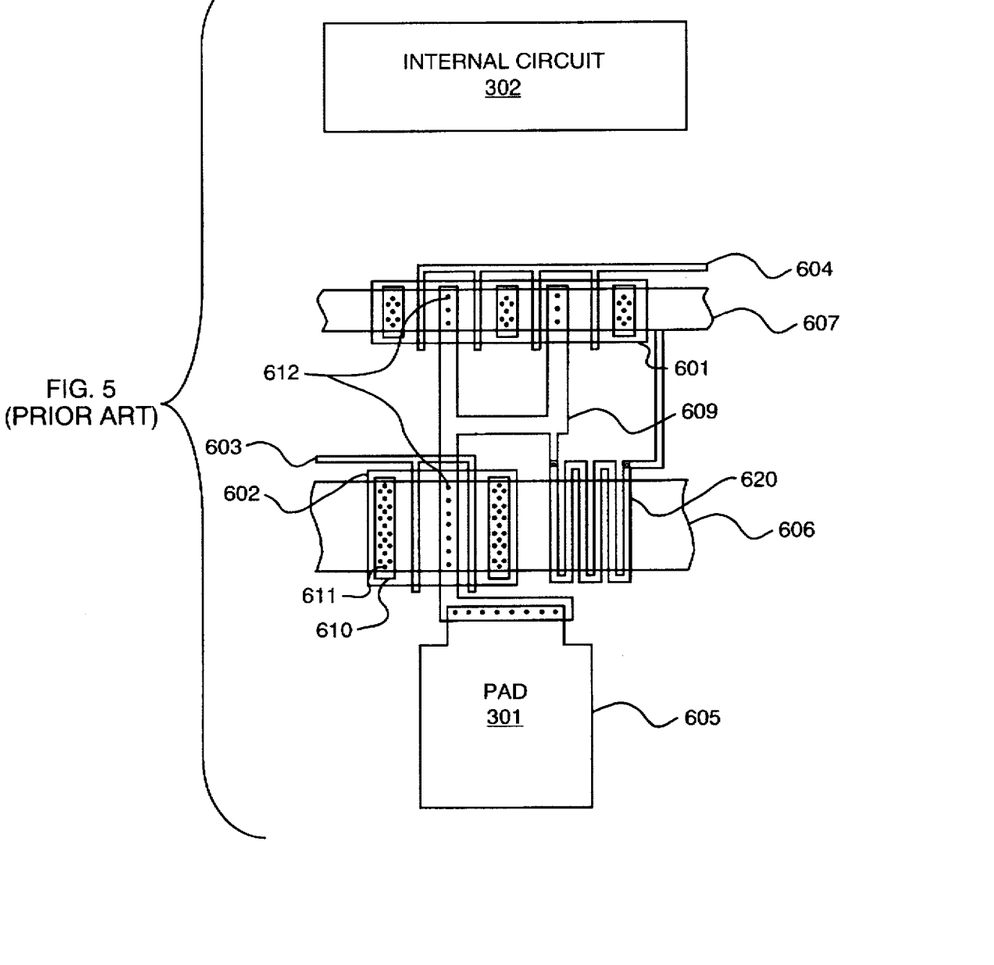
FIG. 5 shows the details of the arrangement of the circuit of FIG. 4.

FIG. 5 shows details of the circuit configuration of FIG. 4. In FIG. 5, circuit elements corresponding to those of FIG. 3 are denoted by the same reference numerals.

P-channel diffusion layer 601 represents an area made up by the source and drain of p-channel MOSFET 207. Polysilicon 604 is the gate of p-channel MOSFET 207. Second aluminum wiring 607 is wiring for supplying the power-source potential to p-channel MOSFET 207 as the source potential.

N-type diffusion layer 602 represents an area made up by the source and drain of n-channel MOSFET 208. Polysilicon 603 is the gate of n-channel MOSFET 208. Second aluminum wiring 606 is wiring for supplying the ground potential to n-channel MOSFET 208 as the source potential. First aluminum wiring 609 connects pad 301 with the drain of p-channel MOSFET 207 and the drain of n-channel MOSFET 208 by way of diffusion layer-first aluminum contacts 612.

In addition, n-type diffusion layer 620 acts as pull-up resistance 203, is arranged to the side of n-channel MOSFET 208 on the substrate, and is connected between second aluminum wiring 607, which is applied with the power-source potential, and first aluminum wiring 609, which is connected to the terminal (pad 301).

Figure 6:
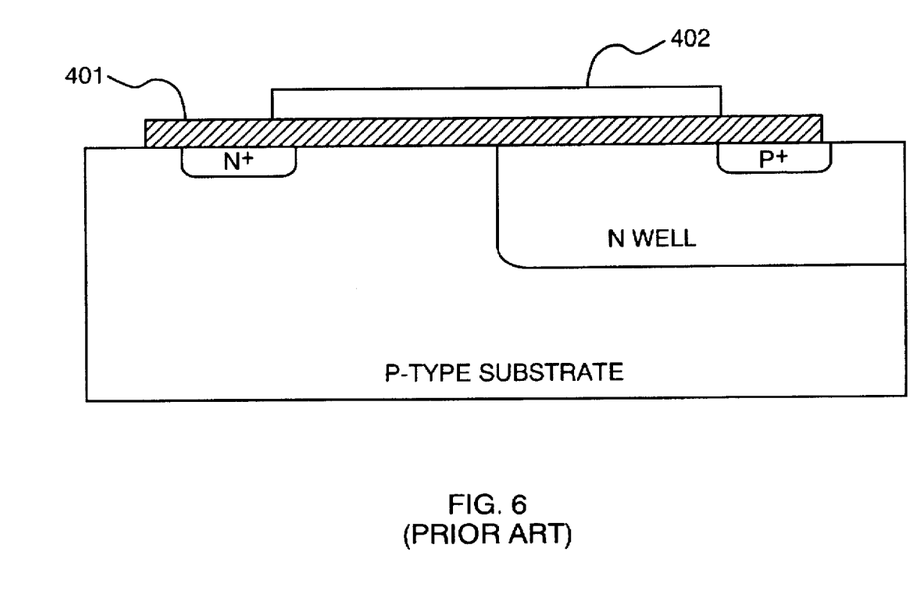
FIG. 6 is a sectional view showing the construction of an example in which a pull-up or pull-down resistance is made of polysilicon.

In a different example, pull-up resistance 203 is formed not of a diffusion layer, but of a resistor which does not make a pn junction such as polysilicon. The construction of such an example is shown in the section view of FIG. 6. In this example, dielectric layer 401 is formed on a substrate in which the drains of n-channel MOSFET 208 and p-channel MOSFET 207 are formed, and polysilicon resistor 402 is formed on the dielectric layer 401. A resistor formed of resistance material such as polysilicon that does not make a pn junction has no contribution to an npnp structure which constitutes a parasitic thyristor, and accordingly, as shown in FIG. 6, offers the advantage that it can be arranged with no need to be spaced apart from other elements.

LSI in which CMOSFET is employed is commonly referred to as CMOS-type LSI, and CMOS-type LSI typically suffers from the problem known as latch-up. Latch-up refers to a phenomenon wherein current flows through a parasitic thyristor which a CMOS structure structurally tends to involve, causing at worst a chip to be lead to breakdown.

Figure 7:
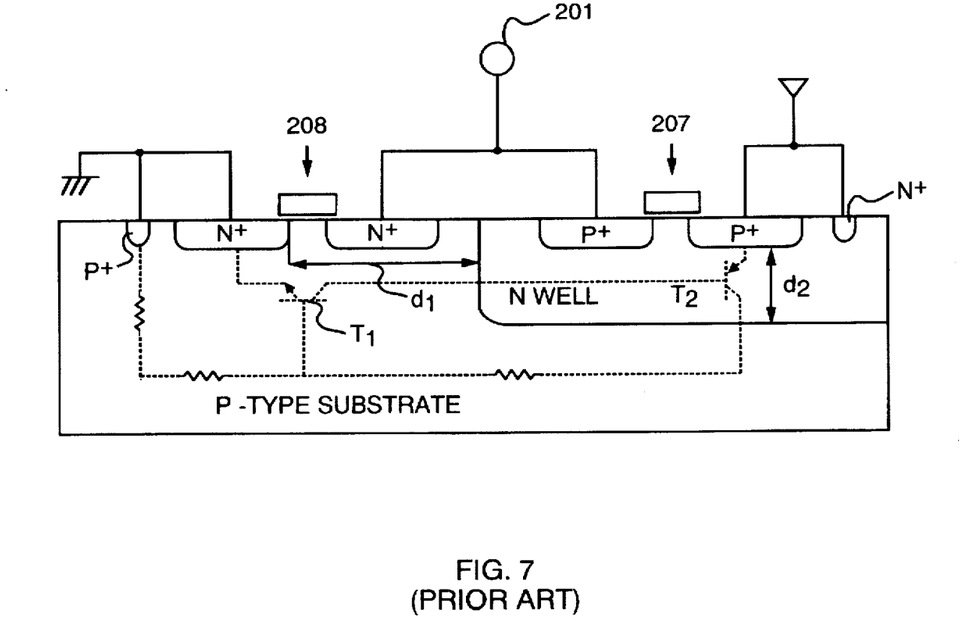
FIG. 7 is a sectional view showing the construction of one example of a CMOS circuit to illustrate the structure of a parasitic thyristor.
Figure 8:
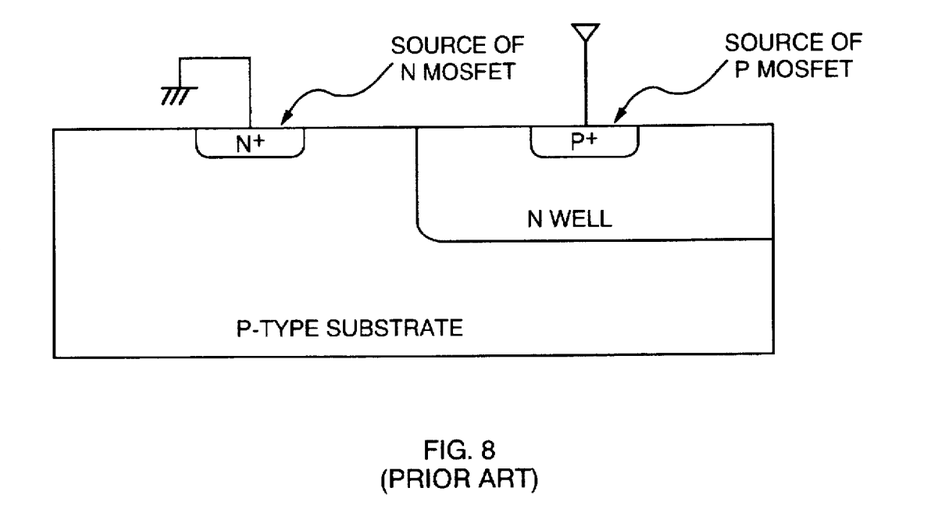
FIG. 8 shows the parasitic thyristor structure of the circuit of FIG. 7.

FIG. 7 shows a structural section of one example of a CMOS circuit to illustrate a parasitic thyristor structure, and FIG. 8 shows the structure of the parasitic thyristor of the circuit in FIG. 7.

As can be understood from FIG. 7, the source of n-channel MOSFET 208, the p-type substrate, and the n-well make up a parasitic npn bipolar transistor $T_1$, and the p-type substrate, the n-well, and the source of p-channel MOSFET 207 make up a parasitic pnp bipolar transistor $T_2$. A parasitic thyristor is thus formed by the source of n-channel MOSFET 208, the p-type substrate, the n-well, and the source of p-channel MOSFET 207, as shown in FIG. 8.

In the circuit of FIG. 7, if for some reason current is introduced to the p-type substrate corresponding to the base of transistor $T_1$ (the first gate of the thyristor), or to the n-well corresponding to the base of transistor $T_2$ (the second gate of the thyristor), then the parasitic thyristor of pnpn structure between the power source and ground is caused to operate and a large flow of current is triggered, thereby resulting in what is known as latch-up. In CMOS semiconductor devices, latch-up is most frequently caused when the potential of terminal 201 exceeds the power source potential or falls below the ground potential, i.e., when overvoltage is applied to terminal 201.

As shown in FIG. 7, the terminal is normally connected to a p-type diffusion layer and an n-type diffusion layer which respectively form the drain of p-channel MOSFET and the drain of n-channel MOSFET making up the CMOS. For example, if a potential lower than the ground potential is applied to terminal 201, the pn junction produced between the drain of n-channel MOSFET 208 connected to terminal 201 and the p-type substrate connected to the ground is applied with a forward bias and consequently a large current flows. A part of this large current flowing to the p-type substrate reaches the adjacent thyristor structure shown in FIG. 8 by diffusion.

When the current introduced to the first gate region is sufficient to place the thyristor in a conductive state, the parasitic thyristor enters a conductive state and a large current flows, allowing latch-up to be triggered.

Latch-up of a parasitic thyristor also occurs when the potential of terminal 201 exceeds the power-source potential. In such a case, a forward voltage is applied at the pn junction between the n-well and the p-type diffusion layer making up the drain of p-channel MOSFET 207, allowing current to flow through this pn junction. When this current reaches the parasitic thyristor structure and is injected to the base of transistor $T_2$, the parasitic thyristor enters a conductive state allowing a large current to flow and consequently latch-up to be triggered.

This conductive state of the parasitic thyristor allows the current to continuously flow from the voltage supply to the ground until the potential of the operating voltage supply is lowered.

Because such latch-up leads to failure at worst in a chip, a chip must be designed to limit the occurrence of latch-up to a minimum. When the degree of integration of LSI is low and the distance between a p-channel MOSFET and an n-channel MOSFET is large, the problem of latch-up need not be addressed because base widths $d_1$ and $d_2$ of transistors $T_1$ and $T_2$ in FIG. 7 are large, the amplification degree ($h_{FE}$) of transistors $T_1$ and $T_2$ is consequently reduced, and latch-up is deterred. However, if a p-channel MOSFET and an n-channel MOSFET are placed in greater proximity to raise the degree of integration, base widths $d_1$ and $d_2$ decrease, the amplification degree of transistors $T_1$ and $T_2$ increases, and the possibility of latch-up is increased.

In order to suppress latch-up, therefore, it is common to keep the distances particularly from the p-type and n-type diffusion layers directly connected with the terminal to other p-type diffusion layers and n-type diffusion layers at a value larger than a predetermined value. The reason for this is that such an arrangement of the diffusion layers allows a current large enough to trigger latch-up to be prevented from flowing to the parasitic thyristor from the p-type and n-type diffusion layers that are directly connected to the terminal. It is to be noted that the p-type and n-type diffusion layers directly connected to the terminal can act as the infiltration points of the current that will likely lead to the occurrence of latch-up when overvoltage is applied to the terminal. In other words, the above-described distances are determined to increase base widths $d_1$ and $d_2$ of parasitic transistors $T_1$ and $T_2$ and to decrease the amplification degree of parasitic transistors $T_1$ and $T_2$.

In the layout represented in FIG. 2, necessary distances are kept not only between n-channel MOSFET 208 and p-channel MOSFET 207, but also between pull-up resistance 203 and internal circuit 302. The reason for such a distance being kept between pull-up resistance 203 and internal circuit 302 as well is that pull-up resistance 203 is also an n-type diffusion layer directly connected to pad 301, i.e., terminal 201 and that even if current infiltration into p-type substrate is insufficient to trigger latch-up, such current infiltration may still result in malfunctioning of internal circuit 302.

As can be seen from the layout shown in FIG. 2, a prior-art layout for suppressing the occurrence of latch-up has the disadvantages of large surface-area and increased cost.

Although arranging pull-up resistance 203 to the side of n-channel MOSFET 208 as shown in the example of FIG. 4 results in n-channel MOSFET 208 having a thicker shape, removal of pull-up resistance 203 from between internal circuit 302 and p-channel MOSFET 207 affords the advantage of reduced distance between internal circuit 302 and p-channel MOSFET 207 as compared with the example shown in FIG. 2. However, in this case as well, the chip surface area is increased because no elements are disposed in the spaces between n-channel MOSFET 208 and p-channel MOSFET 207 or between p-channel MOSFET 207 and internal circuit 302. In other words, the layout shown in FIG. 4 attempts an improvement over the example of FIG. 2 in terms of reduced chip area but still entails the disadvantage of increased cost.

In the arrangement shown in FIG. 6, the placement of pull-up resistance 402 in greater proximity to other circuit elements allows a decrease in chip surface area. However, polysilicon generally has a lower resistance value per unit surface area compared with p-type diffusion layers and n-type diffusion layers, and polysilicon therefore entails the disadvantage that, in order to produce an equal resistance value, surface area must be increased compared to p-type diffusion layers and n-type diffusion layers, thereby resulting in increased chip area and increased cost.

As described in detail above, the semiconductor devices of the prior art have the disadvantage that, when the distance between diffusion layers is increased to suppress latch-up of parasitic thyristors, the degree of integration of integrated circuits decreases, and as a result, both chip size and manufacturing costs increase.

The object of the present invention is to provide a semiconductor device that inhibits occurrence of latch-up when overvoltage is applied to a terminal without increasing the size of a chip.

SUMMARY OF THE INVENTION

A first semiconductor device according to the present invention is a semiconductor device having a pull-up or pull-down resistor connected between a terminal and an operating voltage supply, the pull-up or pull-down resistance is made up of two serially connected resistances, and of these serially connected resistances, the resistance connected to the terminal is formed of a resistance material that does not form a pn junction with the semiconductor substrate, and the other resistance is of a diffusion layer of a conduction type that forms a pn junction with the semiconductor substrate. In the following description, the resistance which is connected to the terminal and is formed of a resistance material that does not form a pn junction with the semiconductor substrate will be referred to as the first resistance, and the other resistance formed as a diffusion layer of the conduction type that forms a pn junction with the semiconductor substrate will be referred to as the second resistance.

Accordingly, even if a parasitic pn junction produced by the second resistance and semiconductor substrate is biased in a forward direction by application of overvoltage to the terminal, parasitic current flowing through the pn junction is suppressed to a reduced level by means of a voltage drop due to the first resistance in the current supply path.

A second semiconductor device of the present invention is a semiconductor device having a CMOSFET, a terminal connected to the node connecting the drain of a p-channel MOSFET and the drain of an n-channel MOSFET the p-channel and n-channel MOSFETs making up the CMOSFET, and a pull-up or pull-down resistance connected between the terminal and an operating voltage supply. The pull-up or pull-down resistance is made up of two serially connected resistances; of the serially connected resistances, the resistance connected to the terminal (the first resistance) is formed of a resistance material that does not form a pn junction with the semiconductor substrate, and the other resistance (the second resistance) is formed as a diffusion layer of a conduction type that forms a pn junction with the semiconductor substrate.

As explained with reference to FIGS. 7 and 8, a CMOSFET inherently includes a thyristor structure, and the drain region of the n-channel MOSFET and the drain region of the p-channel MOSFET of the CMOSFET correspond to the gate regions of the parasitic thyristor. Accordingly, in order to suppress latch-up of the parasitic thyristor, the parasitic current flowing through a parasitic pn junction made up by both pull-up or pull-down resistance connected to the above-described drain regions and the semiconductor substrate must be suppressed at least to a level that does not trigger such latch-up. Such suppression can be achieved by forming the pull-up or pull-down resistances using the first and second resistances of the present invention.

As the layout of the second semiconductor device of the present invention, a p-channel MOSFET and an n-channel MOSFET are preferably laid out on a semiconductor substrate at the minimum spacing that can prevent the occurrence of latch-up in a parasitic thyristor composed of the semiconductor substrate and CMOSFET when overvoltage is applied to the terminal, and, moreover, the first and second resistances are preferably laid out on the semiconductor substrate between the p-channel MOSFET and the n-channel MOSFET. By means of this arrangement, the empty space between the p-channel MOSFET and the n-channel MOSFET can be effectively used while still deterring latch-up, thereby allowing an improvement in the degree of integration of LSI.

A third semiconductor device of the present invention is a semiconductor device having an input/output buffer circuit, and this input/output buffer circuit includes a CMOSFET, an input/output terminal connected to a node connecting the drain of a p-channel MOSFET and the drain of an n-channel MOSFET, the p-channel MOSFET and the n-channel MOSFET making up the CMOSFET, a pull-up or pull-down resistor connected between the input/output terminal and an operating voltage supply, and an input buffer circuit connected between an internal circuit and the node.

When a signal is transmitted from the internal circuit to an external circuit by way of the input/output terminal, an identical signal corresponding to the signal to be transmitted is applied to the gate of p-channel MOSFET and the gate of n-channel MOSFET. When a signal is received from an external circuit by way of the input/output terminal, a high-level signal and a low-level signal are applied to the gate of the p-channel MOSFET and the gate of the n-channel MOSFET, respectively.

The pull-up or pull-down resistor of this input/output buffer circuit is made up of two serially connected resistances, and of these serially connected resistances, the resistance connected to the input/output terminal is formed of a resistance material that does not form a pn junction with the semiconductor substrate, and the other resistance is formed as a diffusion layer of a conduction type that forms a pn junction with the semiconductor substrate.

The third semiconductor device of the present invention is an application of the second semiconductor device of the present invention to a CMOS input/output buffer circuit. The features of this device are basically equivalent to those of the second semiconductor device of the present invention.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 9:
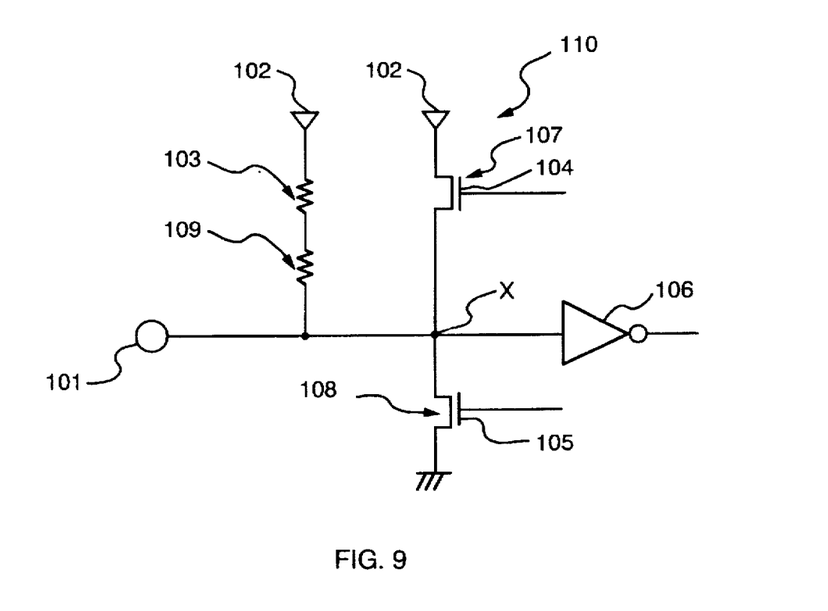
FIG. 9 is a circuit diagram showing an embodiment of the present invention.

Embodiments of the present invention will next be explained with reference to the accompanying drawings. FIG. 9 is a circuit diagram showing an embodiment of the present invention. The circuit of the present embodiment is constructed in basically the same way as the circuit of FIG. 1, the difference being that the pull-up resistance is constructed by serial connection of pull-up resistance 103 formed of an n-type diffusion layer and pull-up resistance 109 formed of polysilicon.

The circuit shown in FIG. 9 is an input/output buffer circuit that can be operated both as an input buffer circuit and as an output buffer circuit. This circuit is made up of terminal 101, pull-up resistances 103 and 109, CMOS circuit 110, and input buffer 106. The output point X of CMOS circuit 110 (the node connecting both of the drain of p-channel MOSFET 107 and the drain of n-channel MOSFET 108) is connected to both terminal 101 and the input terminal of input buffer 106. The pull-up resistor is composed of serially connected pull-up resistance 103 and pull-up resistance 109, the end of the pull-up resistor terminated by an end of the pull-up resistance 103 is connected to operating voltage supply 102, and the other end of the pull-up resistor (the end of pull-up resistance 109) is connected to terminal 101. When the input/output buffer circuit of FIG. 9 is used as an input buffer circuit, terminal 101 is used as an input terminal, and when the input/output buffer circuit of FIG. 9 is used as an output buffer, terminal 101 is used as an output terminal.

As in the circuit shown in FIG. 1, the output of a two-output gate circuit (not shown) is supplied to both of gate 104 of p-channel MOSFET 107 and gate 105 of n-channel MOSFET 108. When the input/output buffer circuit is used as an input buffer circuit, this not-shown two-output gate circuit deters the output of supplied data signals, supplies high level to gate 104 of p-channel MOSFET 107, and also supplies low level to gate 105 of n-channel MOSFET 108. Accordingly, p-channel MOSFET 107 and n-channel MOSFET 108 both enter a high-impedance (non-conductive) state. As a result, signals received at terminal 101 are directly supplied to input buffer 106, and after signal level is discriminated by this input buffer 106, the discriminated signals are transmitted from input buffer 106 to an internal circuit of the LSI. If signals are not being supplied to terminal 101 from the outside, the potential of terminal 101 is made high level by the pull-up resistor made up of pull-up resistance 103 of n-type diffusion layer and pull-up resistance 109 of polysilicon.

In addition, when the input/output buffer circuit is used as an output buffer circuit, the not-shown two-output gate circuit delivers identical signals corresponding to supplied data signals to both of gate 104 of p-channel MOSFET 107 and gate 105 of n-channel MOSFET 108. CMOS circuit 210 therefore operates as a CMOS inverter in this case. As a result, signals supplied to the gates of both p-channel MOSFET 107 and n-channel MOSFET 108 are inverted and transmitted to an external circuit by way of terminal 101.

Figure 10:
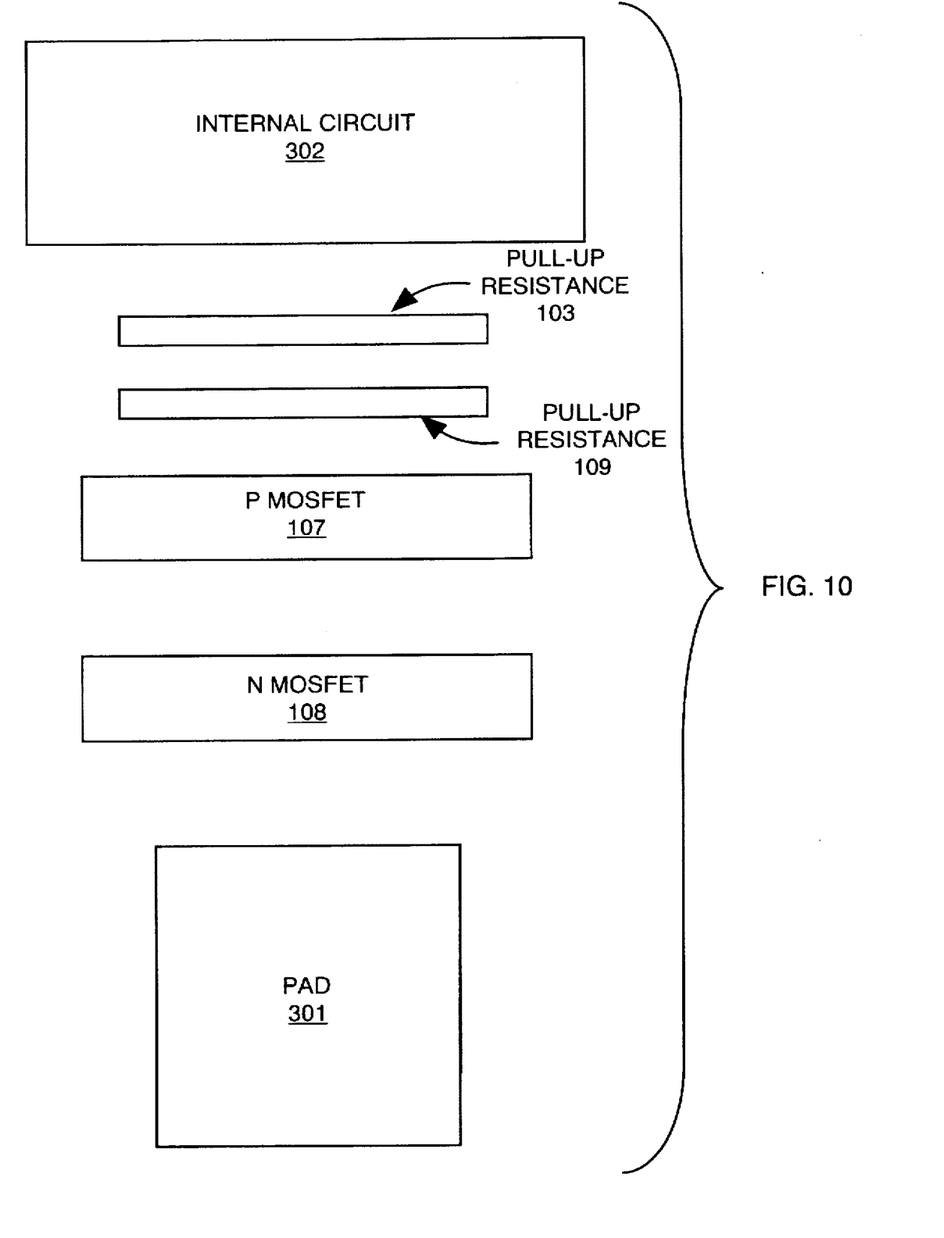
FIG. 10 is a plan view showing the first arrangement of the circuit of FIG. 9.

FIG. 10 is a plan view showing a first example of the layout of an embodiment of the present invention. In FIG. 10, pull-up resistance 103 formed of an n-type diffusion layer and pull-up resistance 109 formed of polysilicon are arranged between p-channel MOSFET 107 and internal circuit 302. Regarding spacing, a fixed interval is kept for the space between internal circuit 302 and p-channel MOSFET 107 and the space between p-channel MOSFET 107 and n-channel MOSFET 108; and the space between pull-up resistance 103 of n-type diffusion layer and internal circuit 302, the space between pull-up resistance 109 of polysilicon and pull-up resistance 103 of n-type diffusion layer; and the space between pull-up resistance 109 of polysilicon and p-channel MOSFET 107 are each of shorter dimension.

Figure 11:
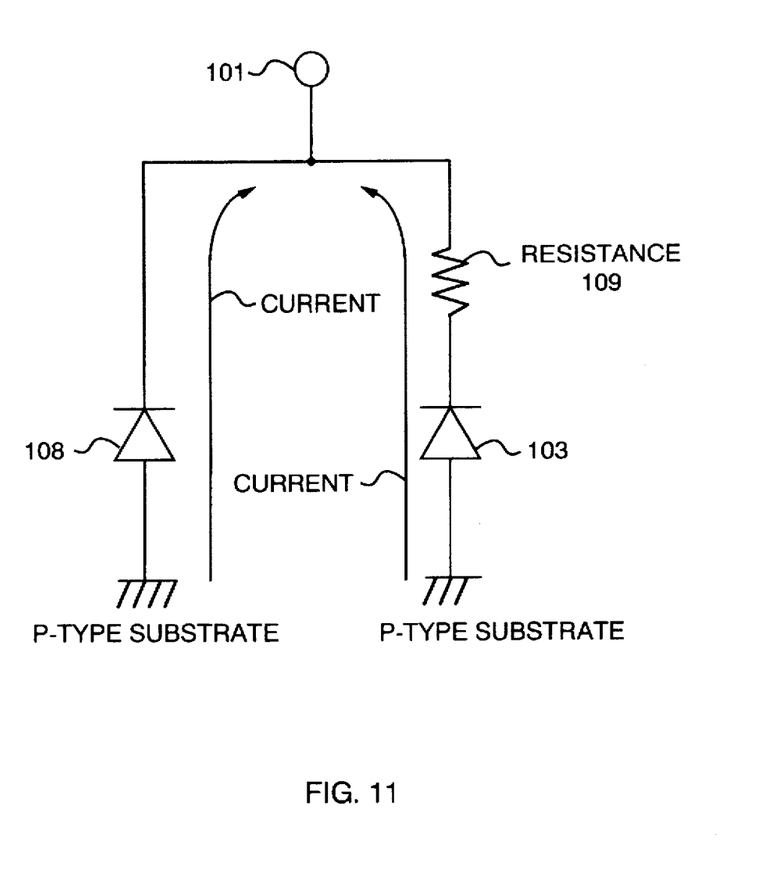
FIG. 11 shows an equivalent circuit to illustrate the operations of the parasitic diodes when overvoltage is applied to the input terminal of the circuit of FIG. 9.

A case will next be considered for this embodiment in which a lower potential than ground, i.e., overvoltage, is applied to terminal 101. FIG. 11 is an equivalent circuit of parasitic diodes for a case in which a lower potential than ground is applied to terminal 101. As can be seen from FIG. 9, terminal 101 is connected to the p-type diffusion layer making up the drain of p-channel MOSFET 107, the n-type diffusion layer making up the drain of n-channel MOSFET 108, and, by way of pull-up resistance 109 of polysilicon, the n-type diffusion layer of pull-up resistance 103. Of these, the p-type diffusion layer making up the drain of p-channel MOSFET 107 can be removed from consideration because the pn junction made up by this p-type diffusion layer together with the n-well assumes reverse bias when the potential of terminal 101 is lower than ground and therefore does not constitute a parasitic diode. The parasitic diodes formed between the p-type substrate and n-type diffusion layer connected to terminal 101 are (i) a parasitic diode made up by p-type substrate and the drain of n-channel MOSFET 108 and (ii) a parasitic diode made up by p-type substrate and pull-up resistance 103. In FIG. 11, an equivalent circuit of the former is shown by the diode connected between terminal 101 and p-type substrate, and an equivalent circuit of the latter is shown by the diode having its anode connected to the p-type substrate and its cathode connected to terminal 101 by way of pull-up resistance 109.

The parasitic diode (i) resulting from n-channel MOSFET 108 and the parasitic diode (ii) resulting from pull-up resistance 103 (formed of n-type diffusion layer) are both applied with forward bias by overvoltage and are therefore both in a conductive state. However, because a drop in voltage across pull-up resistance 109 is caused by the current which flows through the parasitic diode (ii), the forward voltage applied to parasitic diode (ii) is smaller than that applied to the parasitic diode (i). As a result, although current flows through both of parasitic diodes, most of the current flows through the parasitic diode (i) resulting from n-channel MOSFET 108.

Thus, the circuit of the present embodiment allows pull-up resistance 103 to approach internal circuit 302 to the extent that the parasitic current flowing from p-type substrate into pull-up resistance 103 is decreased. This offers the advantage that pull-up resistance 103 can be arranged with no need to be kept apart from other circuit elements.

As has been explained for an example of the prior art, injection of current from the p-type substrate to polysilicon pull-up resistance 109 does not occur when the overvoltage is applied to terminal 101. For this reason, polysilicon pull-up resistance 109 can be arranged close to other elements of the circuit. In addition, while current flows to polysilicon pull-up resistance 109 when the overvoltage is applied to terminal 101, most of the current which flows to terminal 101 flows through the parasitic diode (i) even when the voltage drop across pull-up resistance 109 is lower than the forward voltage of the parasitic diode. Therefore, the polysilicon pull-up resistance 109 does not require a large area.

The present arrangement therefore allows effective use of the area between internal circuit 302 and p-channel MOSFET 107, thereby allowing a consequent reduction of chip area.

Figure 12:
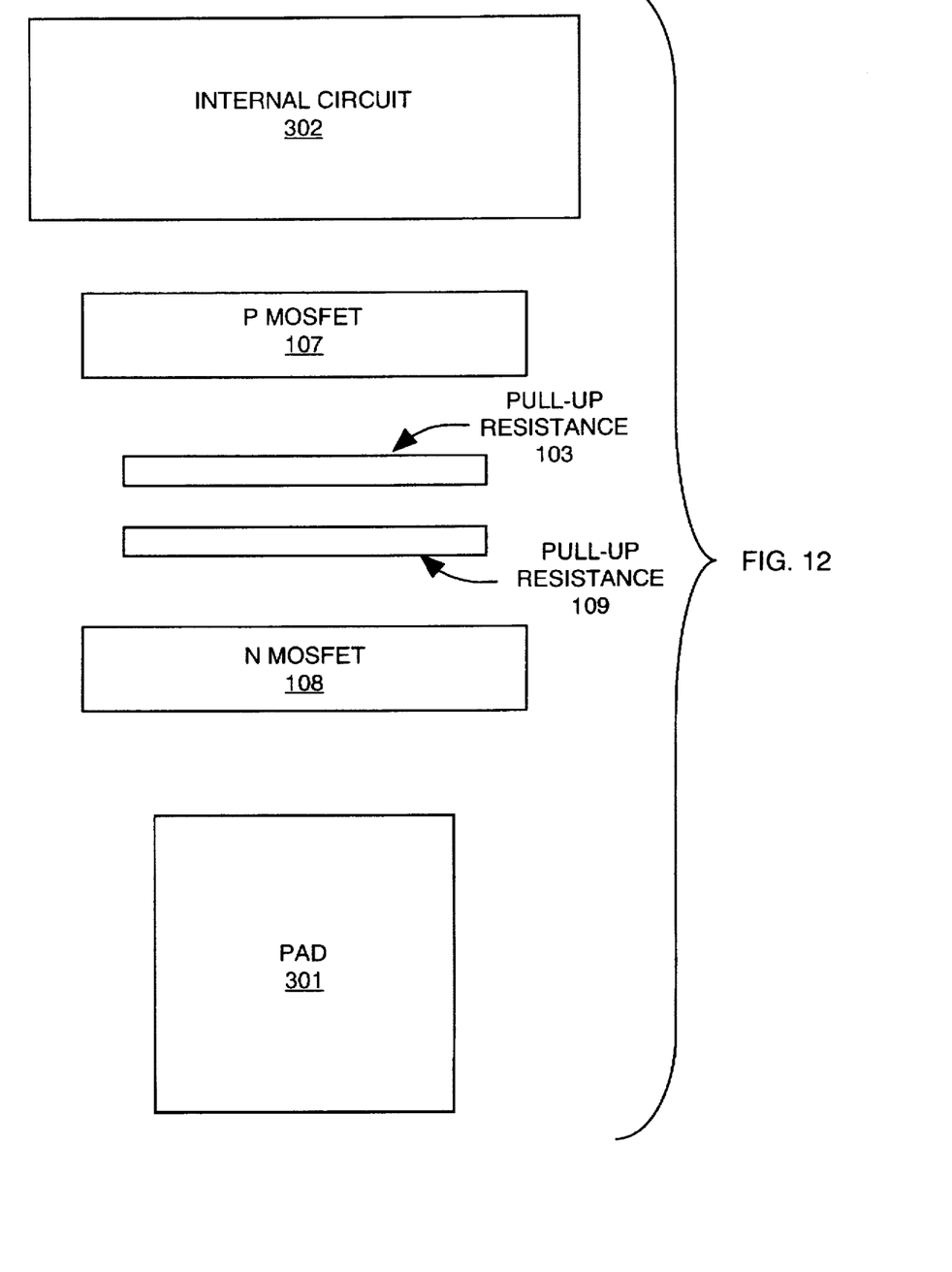
FIG. 12 shows the second arrangement of the circuit of FIG. 9.

FIG. 12 is a plan view showing a second layout of an embodiment of the present invention. In this example, pull-up resistance 103 formed of an n-type diffusion layer and pull-up resistance 109 formed of polysilicon are laid out between p-channel MOSFET 107 and n-channel MOSFET 108. In this arrangement, latch-up tends not to occur even when pull-up resistances 103 and 109 are arranged close to p-channel MOSFET 107 and n-channel MOSFET 108 for the same reasons as for the first layout shown in FIG. 10, and an explanation is therefore here omitted. As with the first layout, the present layout also allows prevention of latch-up while avoiding an increase in chip area. Moreover, because the second layout provides for arrangement of pull-up resistance 103 at a greater distance from internal circuit 302 than the first layout, the second layout allows further reduction of the possibility that latch-up will occur in internal circuit 302 when overvoltage is applied to terminal 101 (pad 301), and also allows reduction of the possibility of a malfunction of internal circuit 302.

While explanation has been presented for pull-up resistances in the above-described embodiments, the same arguments hold true for pull-down resistances. This is because the present invention takes as the object of consideration the parasitic current flowing through a parasitic diode produced by the semiconductor substrate and diffusion layer resistance connected to the terminal and does not concern itself with the normal circuit current supplied to the diffusion layer resistance from the power source, and it is therefore of no consequence in the present invention whether one end of the pull-up resistor is connected to the positive or negative electrode of the operating voltage supply.

Figure 13:
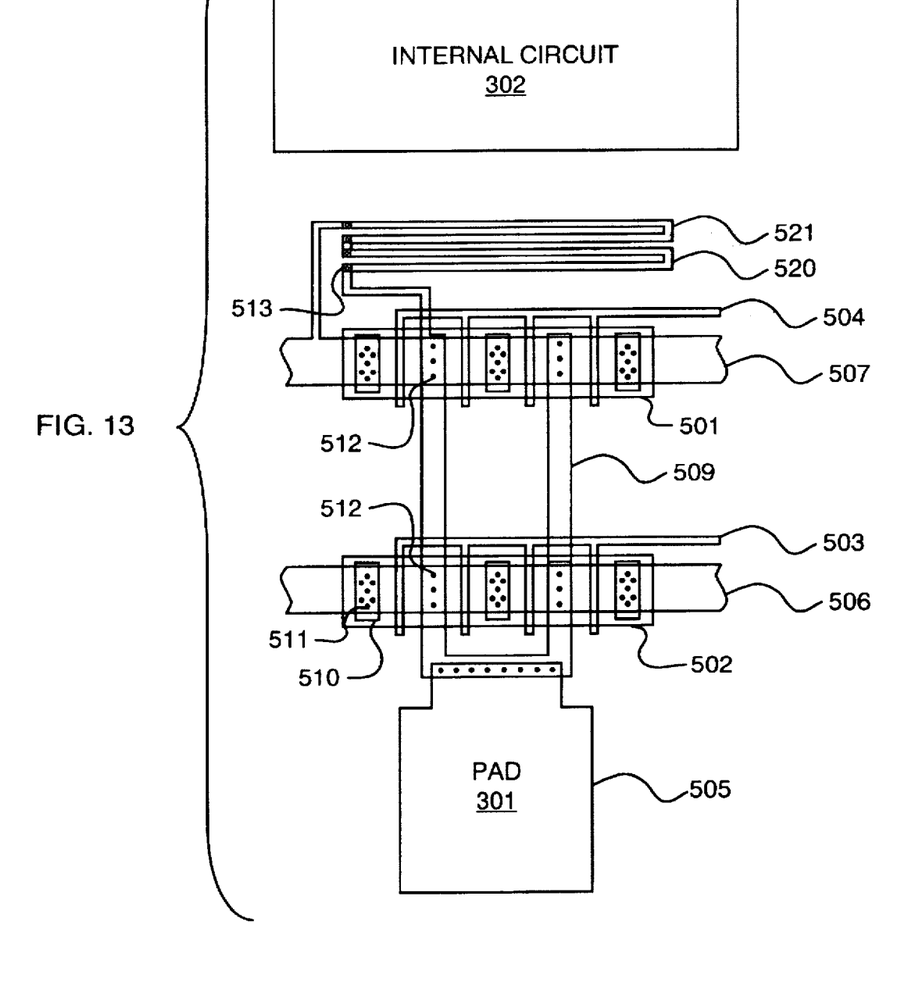
FIG. 13 is a plan view showing details of the arrangement of FIG. 10.

FIG. 13 is a plan view showing the details of the arrangement of the circuit of FIG. 10. In FIG. 13, p-type diffusion layer 501 is the region in which are formed the source and drain of p-channel MOSFET 107. Polysilicon 504 is the gate of p-channel MOSFET 107. Second aluminum wiring 507 supplies the power source potential (the potential of operating voltage supply 102) to p-channel MOSFET 107 as the source potential by way of diffusion layer-first aluminum (DL-1Al) contacts.

N-type diffusion layer 502 is the region in which are formed the source and drain of n-channel MOSFET 108. Polysilicon 503 is the gate of n-channel MOSFET 108. Second aluminum wiring 506 supplies the ground potential to n-channel MOSFET 108 as the source potential by way of first diffusion layer aluminum contacts 511. First aluminum wiring 510, as with first aluminum wiring 610 of FIG. 5, is wiring for connecting the diffusion layer with second aluminum wiring, which is upper-layer wiring.

First aluminum wiring 509 connects the drain of p-channel MOSFET 107 to the drain of n-channel MOSFET 108 by way of first diffusion layer aluminum (DL-1Al) contacts 512, and in addition, connects these drains to pad 301. Pad 301, as with pad 301 of FIG. 5, is formed of second aluminum wiring. As explained hereinabove, terminal 101 is included in pad 301.

Polysilicon 520 makes up pull-up resistance 109, and n-type diffusion layer 521 makes up pull-up resistance 103. These pull-up resistances 109 and 103, i.e., polysilicon 520 and n-type diffusion layer 521, are serially connected between second aluminum wiring 507 which supplies the power source potential and first aluminum wiring 509 which is connected to the terminal (pad 301). First polysilicon aluminum (polysilicon-1Al) contacts 513 serve for connecting polysilicon 520 and first aluminum wiring 509. The pull-up resistor constituted by serially connecting polysilicon 520 and n-type diffusion layer 521 is positioned on the substrate between p-type diffusion layer 501 and internal circuit 302.

Figure 14:
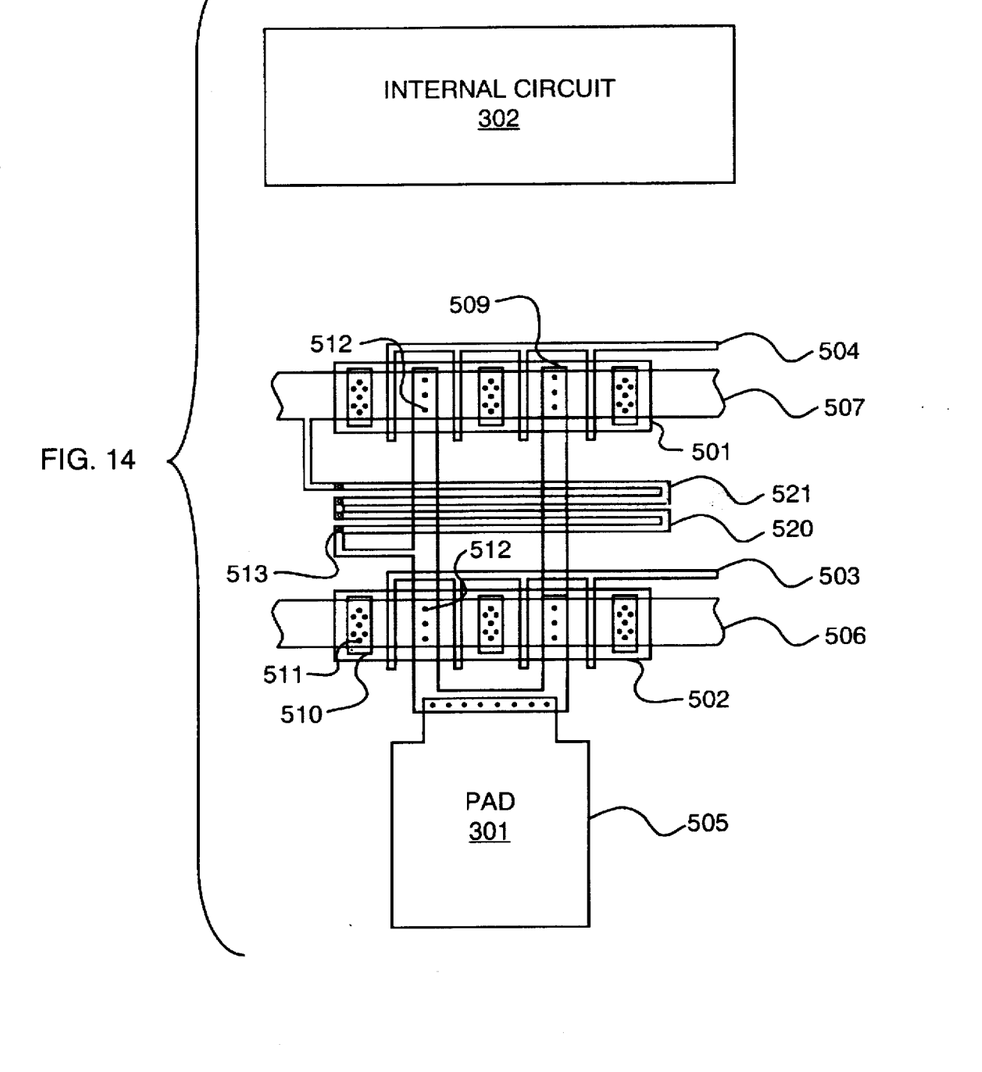
FIG. 14 is a plan view showing details of the arrangement of FIG. 12.

FIG. 14 shows details of the circuit arrangement of FIG. 12. In FIG. 14, circuit elements corresponding to those of FIG. 13 bear the same reference numerals.

P-type diffusion layer 501 is a region in which are formed the source and drain of p-channel MOSFET 107. Polysilicon 504 is the gate of p-channel MOSFET 107. Second aluminum wiring 507 is the wiring by which the power source potential (the potential of operating voltage supply 102) is supplied to p-channel MOSFET 107 as the source potential.

N-type diffusion layer 502 represents a region in which are formed the source and drain of n-channel MOSFET 108. Polysilicon 503 is the gate of n-channel MOSFET 108. Second aluminum wiring 506 is the wiring by which the ground potential is supplied to n-channel MOSFET 108 as the source potential.

First aluminum wiring 509 connects pad 301, the drain of n-channel MOSFET 108, and the drain of p-channel MOSFET 107 by way of diffusion layer-first aluminum contacts 512.

In addition, pull-up resistance 109 made of polysilicon 520 and pull-up resistance 103 made of n-type diffusion layer 521 are serially connected between second aluminum wiring 507, which is the power source potential, and first aluminum wiring 509, which is connected to the pad 301. The pull-up resistor, which is constructed through serial connection of polysilicon 520 and n-type diffusion layer 521, is arranged in a position on the substrate between p-type diffusion layer 501 and n-type diffusion layer 502.

In summary, the pull-up or pull-down resistance of the present invention is constructed by two serially connected resistances, and of these two serially connected resistances, the resistance connected to the terminal is formed of a resistance material that does not form pn junctions with the semiconductor substrate and the other resistance is formed of a diffusion layer of the conduction type that does constitute pn junctions with the semiconductor substrate. The semiconductor device of the present invention has the following effects:

1) The device enables deterrence of parasitic current that passes through a parasitic pn junction formed by a pull-up or pull down resistance and the semiconductor substrate and is introduced into the semiconductor device from a terminal, and moreover, enables deterrence of malfunctions arising due to such a parasitic current and parasitic phenomena triggered by the parasitic current.

2) By applying the pull-up or pull-down resistance of the present invention to a CMOS circuit, the occurrence of latch-up in the thyristor structure inherently present in a CMOS can be prevented, and in addition, the degree of integration of a CMOS semiconductor device can be improved and its chip area decreased.

3) A stabilized semiconductor device can be provided in which the occurrence of latch-up can be deterred even when overvoltage is applied to a terminal without necessitating a semiconductor device of larger chip size and accordingly, without increasing costs.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor device comprising a CMOSFET, a terminal connected to a node connecting a drain of a p-channel MOSFET and a drain of an n-channel MOSFET, the p-channel and n-channel MOSFETs making up said CMOSFET, and a pull-up or pull-down resistor connected between said terminal and an operating voltage supply, said pull-up or pull-clown resistor comprising two serially connected resistances, one of said two serially connected resistances being connected to said terminal and being formed of resistance material that does not form a pn junction with a semiconductor substrate, and the other of said two serially connected resistances being formed of a diffusion layer of a conduction type that forms a pn junction with the semiconductor substrate, wherein said pn junction is forwardly biased toward said resistor connected to said terminal.

2. A semiconductor device according to claim 1, wherein said two serially connected resistances are between said p-channel MOSFET and said n-channel MOSFET on the semiconductor substrate.

3. A semiconductor device comprising an input/output buffer circuit comprising a CMOSFET, an input/output terminal connected to a node connecting a drain of a p-channel MOSFET and a drain of an n-channel MOSFET, the p-channel and n-channel MOSFETs making up said CMOSFET, a pull-up or pull-down resistor connected between said input/output terminal and an operating voltage supply, and an input buffer circuit connected between an internal circuit and said node; wherein, when a signal is transmitted from said internal circuit to an external circuit by way of said input/output terminal, an identical signal corresponding to the signal to be transmitted is applied to gates of said p-channel MOSFET and said n-channel MOSFET, when a signal is received from an external circuit by way of said input/output terminal, a high-level signal and a low-level signal are applied to the gate of said p-channel MOSFET and the gate of said n-channel MOSFET, respectively;

and also wherein said pull-up or pull-down resistor comprises two serially connected resistances, one of said serially connected resistances being connected to said input/output terminal and being formed of a resistance material that does not form a pn junction with a semiconductor substrate, and the other of said two serially connected resistances being formed of a diffusion layer of a conduction type that forms a pn junction with the semiconductor substrate, wherein said pn junction is forwardly biased toward said resistor connected to said terminal.

4. A semiconductor device according to claim 3, wherein said p-channel MOSFET and n-channel MOSFET that make up said CMOSFET are laid out on said semiconductor substrate at a minimum spacing that can prevent occurrence of latch-up caused by a parasitic thyristor formed by said semiconductor substrate and said CMOSFET when overvoltage is applied to said input/output terminal; and wherein said two serially connected resistances are between said p-channel MOSFET and said n-channel MOSFET on said semiconductor substrate.

5. A semiconductor device according to claim 3, wherein said two serially connected resistances are between said internal circuit and said CMOSFET on said semiconductor substrate.

6. A semiconductor device according to claim 1, wherein said one resistance is made of polysilicon.

7. A semiconductor device according to claim 1, wherein said one resistance does not form a pn junction with any portion of said semiconductor device.

8. A semiconductor device according to claim 3, wherein said one resistance does not form a pn junction with any portion of said semiconductor device.

9. A semiconductor device according to claim 3, wherein said one resistance is made of polysilicon.

* * * * *